(12) United States Patent
Zheng et al.

(10) Patent No.: US 12,185,480 B2
(45) Date of Patent: Dec. 31, 2024

(54) FLEXIBLE PAD AND DISPLAY DEVICE

(71) Applicants: MIANYANG BOE OPTOELECTRONICS TECHNOLOGY CO., Ltd., Sichuan (CN); BOE Technology Group Co., Ltd., Beijing (CN)

(72) Inventors: Hongbing Zheng, Beijing (CN); Kangkang Wang, Beijing (CN); Mu Zeng, Beijing (CN); Kuan Zhao, Beijing (CN); Longli Sun, Beijing (CN); Bo Zhang, Beijing (CN)

(73) Assignees: MIANYANG BOE OPTOELECTRONICS TECHNOLOGY CO., Ltd., Sichuan (CN); BOE Technology Group Co., Ltd., Beijing (CN)

( * ) Notice: Subject to any disclaimer, the term of this patent is extended or adjusted under 35 U.S.C. 154(b) by 638 days.

(21) Appl. No.: 17/486,782

(22) Filed: Sep. 27, 2021

(65) Prior Publication Data
US 2022/0201873 A1 Jun. 23, 2022

(30) Foreign Application Priority Data
Dec. 17, 2020 (CN) .......................... 202011495090.8

(51) Int. Cl.
H05K 5/00 (2006.01)
(52) U.S. Cl.
CPC .................................. H05K 5/0017 (2013.01)
(58) Field of Classification Search
CPC .................................................. H05K 5/0017
See application file for complete search history.

(56) References Cited

U.S. PATENT DOCUMENTS

| | | | |
|---|---|---|---|
| 2016/0085330 A1* | 3/2016 | Namkung | G06F 1/1626 29/729 |
| 2018/0136750 A1 | 5/2018 | Namkung et al. | |
| 2020/0047475 A1 | 2/2020 | Gao et al. | |

FOREIGN PATENT DOCUMENTS

| | | | | |
|---|---|---|---|---|
| CN | 108648630 A | 10/2018 | | |
| CN | 108693998 A | 10/2018 | | |
| CN | 109451687 A | * 3/2019 | ............. | G05B 19/05 |
| CN | 210837808 U | 6/2020 | | |
| CN | 111862796 A | 10/2020 | | |

(Continued)

OTHER PUBLICATIONS

CN-109451687-A Zhu et al. English translation from Search (Year: 2019).*
CN202011495090.8 first office action.

*Primary Examiner* — Alicia J Weydemeyer
*Assistant Examiner* — Laura B Figg
(74) *Attorney, Agent, or Firm* — IPro, PLLC

(57) ABSTRACT

The present disclosure relates to a flexible pad and a display device. The flexible pad includes a bottom surface; a contact curved surface opposite to the bottom surface, wherein the contact curved surface is configured to be bonded with a display panel; a first side surface; a second side surface opposite to the first side surface; a third side surface; and a fourth side surface opposite to the third side surface; wherein a preset connecting line direction between the first side surface and the second side surface is a first direction, and in the first direction, a distance between the third side surface and the fourth side surface gradually increases from a middle to two sides.

18 Claims, 3 Drawing Sheets

(56) References Cited

FOREIGN PATENT DOCUMENTS

| CN | 111862800 A | 10/2020 |
|---|---|---|
| KR | 20160034468 A | 3/2016 |

\* cited by examiner

FLEXIBLE PAD AND DISPLAY DEVICE

CROSS REFERENCE TO RELATED APPLICATIONS

The present disclosure claims priority to Chinese Patent Application No. 202011495090.8 filed with the China National Intellectual Property Administration on Dec. 17, 2020, the entire contents of which are incorporated herein by its reference.

FIELD

The present disclosure relates to the field of display screen technology, in particular to a flexible pad and a display device.

BACKGROUND

A flexible pad is a key component of curved surface bonding. The service life of the flexible pad directly affects a yield and performance of a display device.

In the related art, a clip is usually used for profiling the flexible pad, and then the flexible pad is bonded with a display panel.

However, due to a limited contact curved surface and a limited width between the flexible pad and the display panel after profiling through the clip, it is easy to cause a very large pressing amount and very high bonding pressure of the flexible pad when it is bonded with the display panel, resulting in defects generated during bonding of the flexible pad, and then shortening the service life of the flexible pad. Hence, the use cost of the flexible pad is increased.

SUMMARY

The present disclosure provides a flexible pad and a display device.

The present disclosure provides the following technical solutions.

A flexible pad, including: a bottom surface; a contact curved surface opposite to the bottom surface, wherein the contact curved surface is configured to be bonded with a display panel; a first side surface; a second side surface opposite to the first side surface; a third side surface; and a fourth side surface opposite to the third side surface; wherein a preset connecting line direction between the first side surface and the second side surface is a first direction, and in the first direction, a distance between the third side surface and the fourth side surface gradually increases from a middle to two sides.

In some embodiments, in the first direction, the distance between the third side surface and the fourth side surface gradually and evenly increases from the middle to the two sides.

In some embodiments, in the first direction, a distance between the bottom surface and the contact curved surface gradually decreases from a middle to two sides.

In some embodiments, in the first direction, the distance between the bottom surface and the contact curved surface gradually and evenly decreases from the middle to the two sides.

In some embodiments, the flexible pad further includes a plurality of cross sections uniformly arranged along the first direction; wherein a difference between areas of any two adjacent cross sections of the plurality of cross sections in a third direction is equal to a difference between areas of the two adjacent cross sections in a second direction, the second direction is a preset connecting line direction between the third side surface and the fourth side surface, and the third direction is a preset connecting line direction between the bottom surface and the contact curved surface.

In some embodiments, in the first direction, a relationship expression that the difference between the areas of the any two adjacent cross sections of the plurality of cross sections in the second direction is equal to the difference between the areas of the two adjacent cross sections in the third direction is: $\Delta S_{hi} = \Delta S_{wli} + \Delta S_{wri}$, wherein $\Delta S_{hi}$ is the difference between areas of the two adjacent cross sections in the third direction; $\Delta S_{wli}$ is a difference between left areas of the two adjacent cross sections in the second direction; and $\Delta S_{wri}$ is a difference between right areas of the two adjacent cross sections in the second direction.

In some embodiments, flexible pad according to claim 1, comprising: n quantity of cross sections uniformly-arranged along the first direction, by the n quantity of cross sections a bonding contact pressure is reduced:

$$F_{normal} = \sum_{i=1}^{n-1}(k_i x_i + \lambda);$$

wherein $F_{normal}$ is the bonding contact pressure, $x_i$ is a difference between heights of two adjacent cross sections, $k_i$ is a contact stiffness corresponding to the difference between the heights of the two adjacent sections; and $\lambda$ is an extraneous factor.

In some embodiments, the first side surface or the second side surface of the flexible pad is provided with a pressure-relief vent corresponding to an opening of the display panel.

In some embodiments, the pressure-relief vent is a blind vent.

In some embodiments, a size of the pressure-relief vent corresponds to a size of the opening of the display panel.

In some embodiments, a material of the flexible pad is silica gel.

In some embodiments, the flexible pad further includes a first groove between the third side surface and the bottom surface and a second groove between the fourth side surface and the bottom surface.

In some embodiments, the first groove and the second groove are provided with inwardly recessed surfaces, respectively.

In some embodiments, a shape of the first groove is the same as or different from a shape of the second groove.

In some embodiments, an orthographic projection of the first groove or the second groove on a cross section perpendicular to the first direction is an arc or an right angle.

A display device, including any of the above flexible pads.

References of the figures: 1—bottom surface; 2—contact curved surface; 3—first side surface; 4—second side surface; 5—third side surface; 6—fourth side surface; 7—cross section; and 8—pressure-relief vent.

DETAILED DESCRIPTION OF THE EMBODIMENTS

Technical solutions of embodiments of the present disclosure will be clearly and fully described below in combination with the accompanying drawings of the embodiments of the present disclosure. Obviously, the described embodiments are a part of, but not all of the embodiments of the present disclosure. On the basis of the embodiments of the present disclosure, all other embodiments obtained by those ordinarily skilled in the art without creative work belong to the protection scope of the present disclosure.

Figure 1:
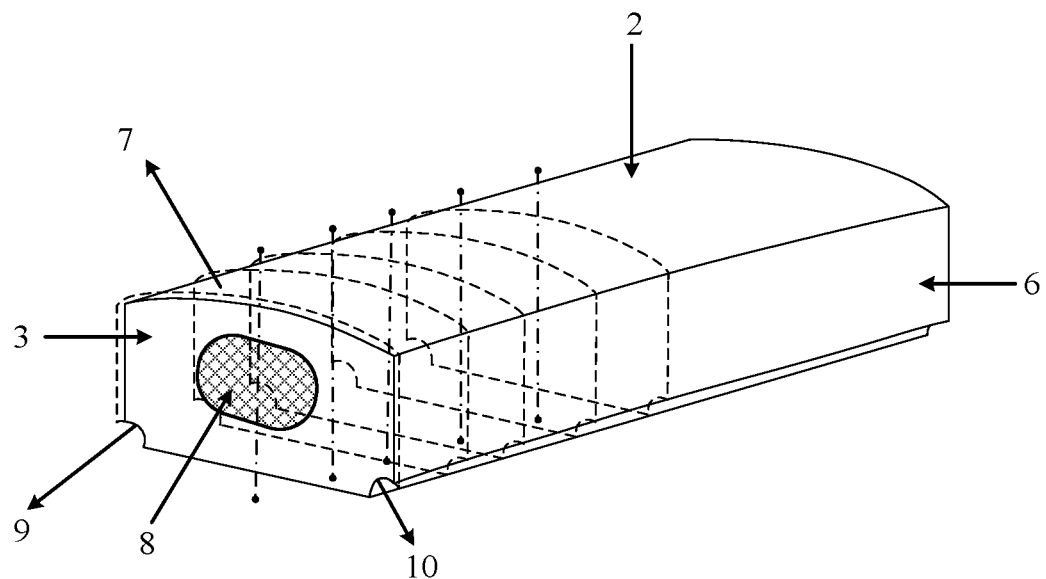
FIG. 1 is a schematic structural diagram of a flexible pad provided by some embodiments of the present disclosure.
Figure 2:
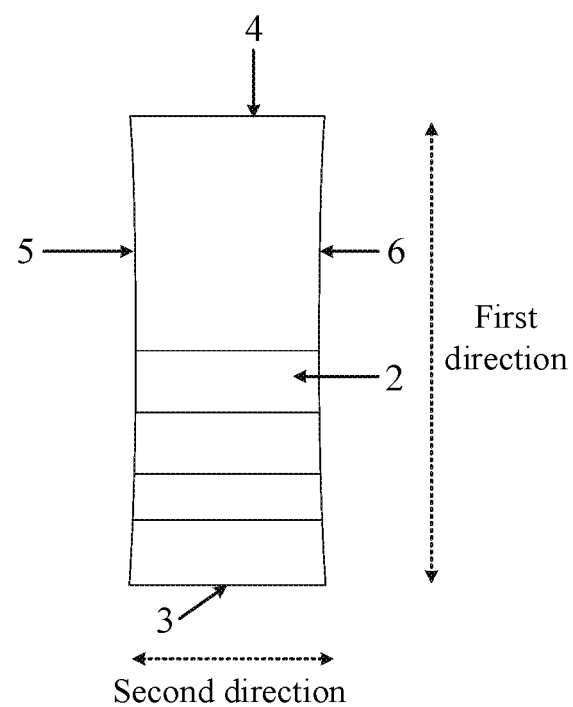
FIG. 2 is a top view of a flexible pad provided by some embodiments of the present disclosure.
Figure 3:
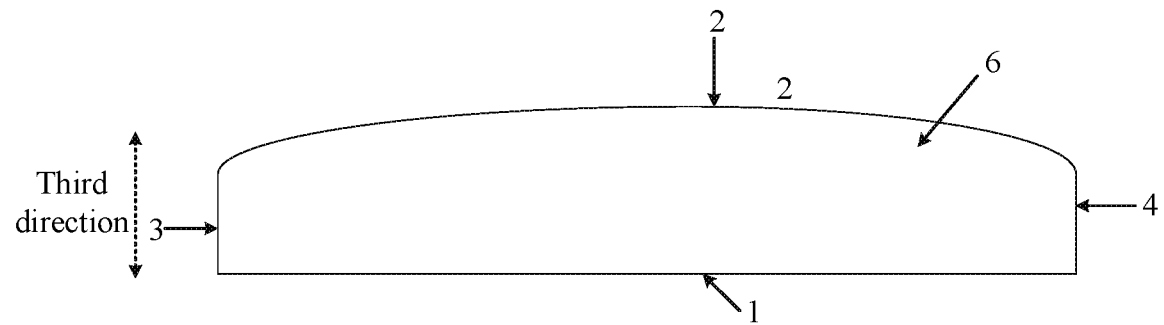
FIG. 3 is a front view of a flexible pad provided by some embodiments of the present disclosure.

FIG. 1 is a schematic structural diagram of a flexible pad provided by an embodiment of the present disclosure. FIG. 2 is a top view of a flexible pad provided by the embodiment of the present disclosure. FIG. 3 is a front view of a flexible pad provided by the embodiment of the present disclosure. As shown in FIGS. 1 to 3, the flexible pad provided by the embodiment of the present disclosure is configured to be bonded with a display panel and is provided with a bottom surface 1, a contact curved surface 2, a first side surface 3, a second side surface 4, a third side surface 5, and a fourth side surface 6. The contact curved surface 2 is configured to be bonded with the display panel; the bottom surface 1 is arranged opposite to the contact curved surface 2; the first side surface 3 is opposite to the second side surface 4; the third side surface 5 is opposite to the fourth side surface 6; a preset connecting line direction between the first side surface 3 and the second side surface 4 is a first direction, as shown by a longitudinal dotted two-way arrow in FIG. 2; and in the first direction, a distance between the third side surface 5 and the fourth side surface 6 gradually increases from a middle to two sides.

According to the flexible pad provided by the embodiment of the present disclosure, in the first direction, the distance between the third side surface 5 and the fourth side surface 6 gradually increases from the middle to the two sides, and during a bonding process between the flexible pad and the display panel, the third side surface 5 and the fourth side surface 6 deform and expand to both sides under the action of pressure, and thus the third side surface 5 and the fourth side surface 6 form a plane approximately along with bonding, so that the pressing amount for the flexible pad is reduced, and a pressure gradient of the contact curved surface 2 of the flexible pad at four corners is reduced.

Therefore, the arrangement may prevent the contact curved surface 2 of the flexible pad from forming low-pressure areas at the four corners, prevent generation of bubbles, and reduce defects generated during bonding of the flexible pad on the display panel, so as to prolong the service life of the flexible pad and reduce the use cost of the flexible pad.

Referring to FIG. 2, in some embodiments, in the first direction, the distance between the third side surface 5 and the fourth side surface 6 gradually and evenly increases from the middle to the two sides.

In the embodiment, in the first direction, the distance between the third side surface 5 and the fourth side surface 6 gradually and evenly increases from the middle to the two sides, and when the flexible pad is bonded with the display panel, expansions of the third side surface 5 and the fourth side surface 6 to both sides remain the same, so that when the flexible pad is bonded with the display panel, a force may be uniform.

In this arrangement, the third side surface 5 and the fourth side surface 6 of the flexible pad may be evenly squeezed, so as to ensure that the contact curved surface 2 of the flexible pad may be uniformly deformed, and further avoid formation of the low-pressure areas at the four corners of the contact curved surface 2. Therefore, it may further reduce the defects caused during bonding of the flexible pad on the display panel, so as to further prolong the service life of the flexible pad and reduce the use cost of the flexible pad.

Referring to FIG. 3, in some embodiments, in the first direction, a distance between the bottom surface 1 and the contact curved surface 2 gradually decreases from a middle to two sides.

In the embodiment, in the first direction, the distance between the bottom surface 1 and the contact curved surface 2 gradually decreases from the middle to the two sides, and the distance between the third side surface 5 and the fourth side surface 6 gradually and evenly increases from the middle to the two sides, so that during the bonding process between the flexible pad and the display panel, the contact curved surface 2 is extruded to be deformed and expands from a center to all around, which further reduces the pressing amount for the flexible pad, so as to better alleviate a pressure between the contact curved surface 2 and the display panel and further reduce a pressure on the flexible pad.

Referring to FIG. 3, in some embodiments, in the first direction, the distance between the bottom surface 1 and the contact curved surface 2 gradually and evenly decreases from the middle to the two sides.

In some embodiments, similarly, in the first direction, the distance between the bottom surface 1 and the contact curved surface 2 gradually and evenly decreases from the middle to the two sides, and the distance between the third side surface 5 and the fourth side surface 6 gradually and evenly increases from the middle to the two sides, so that during the bonding process between the flexible pad and the display panel, deformation of the contact curved surface 2 caused by extrusion will be more uniform, that is, the contact curved surface 2 will expand evenly from the center to a periphery.

In this arrangement, the contact curved surface 2 of the flexible pad may be evenly extruded and evenly deformed, and the formation of the low-pressure areas at the four corners of the contact curved surface 2 is further avoided. Therefore, it may further reduce defects caused during bonding of the flexible pad on the display panel, so as to further prolong the service life of the flexible pad and reduce the use cost of the flexible pad.

Figure 4:
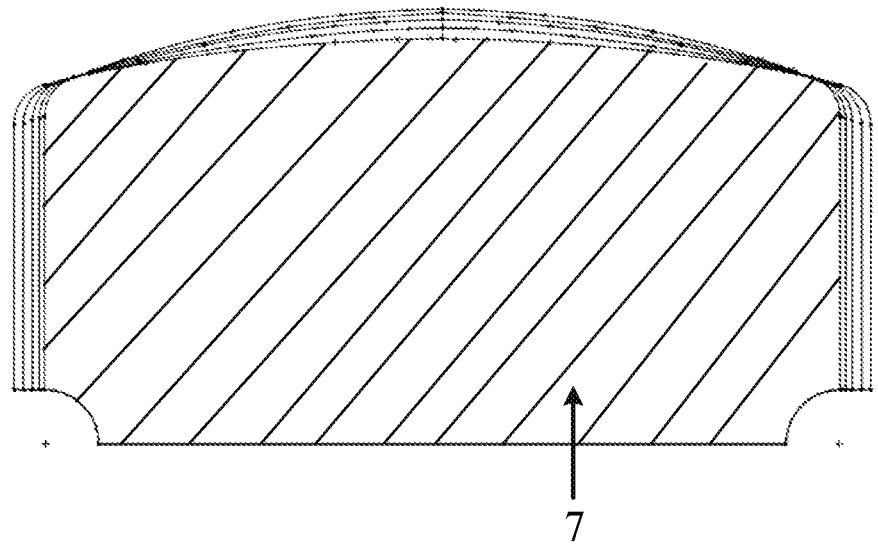
FIG. 4 is a schematic diagram of a cross section of a flexible pad in a first direction provided by some embodiments of the present disclosure.

FIG. 4 is a schematic diagram of a cross section of a flexible pad in a first direction provided by an embodiment of the present disclosure. Referring to FIGS. 2 to 4, in some embodiments, a preset connecting line direction between the third side surface 5 and the fourth side surface 6 is a second direction, as shown by a horizontal dotted two-way arrow in FIG. 2. A preset connecting line direction between the bottom surface 1 and the contact curved surface 2 is a third direction, as shown by a dotted two-way arrow in FIG. 3. The flexible pad has a plurality of cross sections 7 uniformly arranged along the first direction; and a difference between areas of any two adjacent cross sections 7 in the third direction is equal to a difference between areas of the two adjacent cross sections 7 in the second direction.

In some embodiments, the preset connection line direction, i.e., the first direction, between the first side surface 3 and the second side surface 4, is an extension direction from a cross section 7 located in the middle of the flexible pad to the first side surface 3 and an extension direction from this cross section 7 to the second side surface 4. The second direction is located on the paper surface as shown in FIG. 2 and perpendicular to the first direction as shown in FIG. 2. The third direction is perpendicular to the first and second directions.

In the first direction, a relationship expression that the difference between the areas of any two adjacent cross sections 7 in the third direction is equal to the difference between the areas of the two adjacent cross sections 7 in the second direction is:

$$\Delta S_{hi} = \Delta S_{wli} + \Delta S_{wri} \qquad \text{Formula (1)}.$$

In the formula (1), $\Delta S_{hi}$ is the difference between areas of the two adjacent cross sections 7 in the third direction; $\Delta S_{wli}$ is a difference between left areas of the two adjacent cross sections 7 in the second direction; and $\Delta S_{wri}$ is a difference between right areas of the two adjacent cross sections 7 in the second direction.

In addition, it should be noted that if the flexible pad has n quantity of uniformly-arranged cross sections 7 along the first direction, according to the Lagrange's theorem, an expression of a bonding contact pressure that may be reduced by setting the n quantity of cross sections is:

$$F_{normal} = \sum_{i=1}^{n-1} (k_i x_i + \lambda). \qquad \text{Formula (2)}$$

In the formula (2), $F_{normal}$ is the bonding contact pressure that has been reduced by setting the n quantity of cross sections; $x_i$ is a difference between heights of the two adjacent sections (i.e. the difference in the third direction); $k_i$ is a contact stiffness corresponding to the difference between heights of the two adjacent sections; and $\lambda$ is an extraneous factor.

Figure 5:
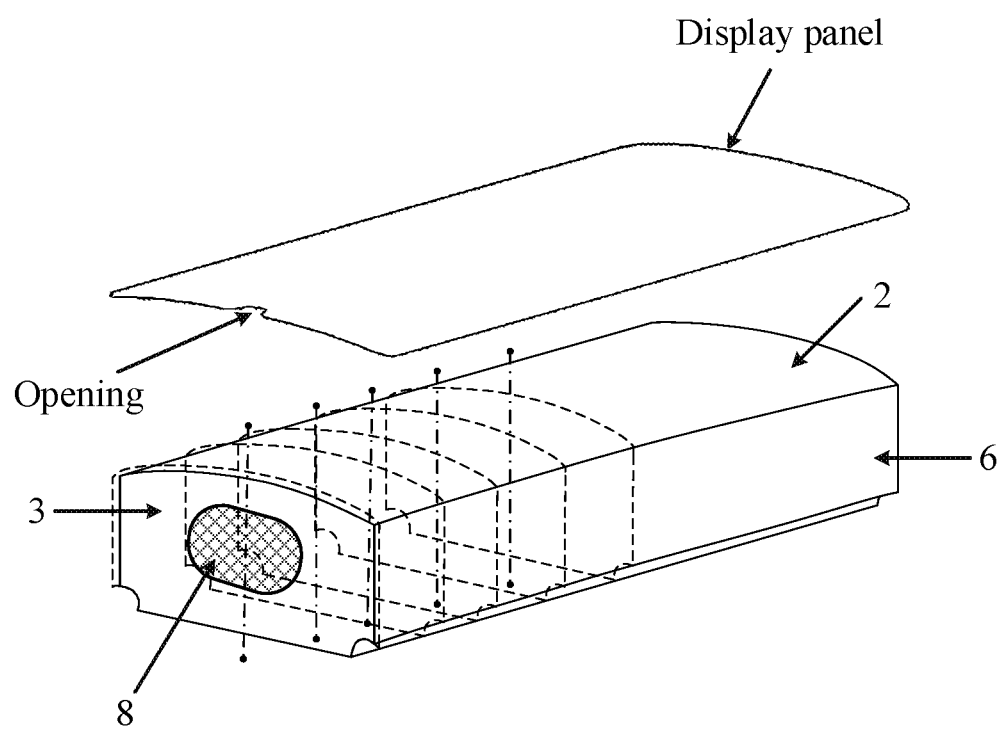
FIG. 5 is a schematic diagram of a position relationship between a flexible pad and a display panel when the flexible pad and the display panel are bonded together provided by some embodiments of the present disclosure.

FIG. 5 is a schematic diagram of a position relationship between a flexible pad and a display panel when bonded together provided by the embodiment of the present disclosure. Referring to FIG. 1 and FIG. 5, in some embodiments, the first side surface 3 or the second side surface 4 of the flexible pad is provided with one pressure-relief vent 8 corresponding to an opening of the display panel.

In some embodiments, the pressure-relief vent 8 is a blind vent. A size of the pressure-relief vent 8 corresponds to a size of the opening of the display panel, and is designed according to a size of the opening of the display panel and the stress between the display panel and the flexible pad.

In the embodiment, due to the fact that the pressure-relief vent 8 corresponds to the opening in the display panel, and plays a role of force relief, when the flexible pad is bonded with the display panel, the contact pressure between the two may be further reduced, so as to more effectively prevent an adverse phenomenon of the flexible pad during bonding, more effectively prolong the service life of the flexible pad, and further reduce the use cost of the flexible pad.

As shown in FIGS. 1, 4 and 5, a groove 9, e.g., a first groove, is located between the third side surface 5 and the bottom surface 1, and another groove 10, e.g., a second groove, is located between the fourth side surface 6 and the bottom surface 1. These two grooves may have inwardly recessed surfaces. The orthographic projection of each of these two grooves on the section may be an arc as shown in FIG. 4, or a right angle (not shown in figures), or other shape that may be engaged with the metal base (not shown in figures). The two grooves may limit the positions of the metal base and the display panel. The shapes of the two grooves can be the same or different.

In some embodiments, a material of the flexible pad is silica gel.

In the embodiment, the silica gel has certain tensile strength and tear strength, which meet the characteristics of certain deformation required by the flexible pad, and chemical properties of silica gel are stable, which will not change the chemical properties due to extrusion, thereby affecting a performance of a whole product.

An embodiment of the present disclosure further discloses a display device, including any of the above flexible pads.

In the embodiment, the beneficial effects of the display device are the same as those of any of the above flexible pads, so that they will not be repeated.

Obviously, those skilled in the art can make various variations and modifications to the disclosure without departing from the spirit and scope of the disclosure. Therefore, if these modifications and variations of the disclosure fall within the scope of the claims of the disclosure and its equivalent technology, the disclosure is also intended to include these modifications and variations.

What is claimed is:

1. A flexible pad, comprising:
   a bottom surface;
   a contact curved surface opposite to the bottom surface, wherein the contact curved surface is configured to be bonded with a display panel;
   a first side surface;
   a second side surface opposite to the first side surface;
   a third side surface; and
   a fourth side surface opposite to the third side surface;
   wherein a preset connecting line direction between the first side surface and the second side surface is a first direction, and in the first direction, a distance between the third side surface and the fourth side surface gradually increases from a middle to two sides;
   wherein the first side surface or the second side surface of the flexible pad is provided with a pressure-relief vent corresponding to an opening of the display panel.

2. The flexible pad according to claim 1, wherein in the first direction, the distance between the third side surface and the fourth side surface gradually and evenly increases from the middle to the two sides.

3. The flexible pad according to claim 1, wherein in the first direction, a distance between the bottom surface and the contact curved surface gradually decreases from a middle to two sides.

4. The flexible pad according to claim 3, wherein in the first direction, the distance between the bottom surface and the contact curved surface gradually and evenly decreases from the middle to the two sides.

5. The flexible pad according to claim 1, further comprising:
   a plurality of cross sections uniformly arranged along the first direction;
   wherein a difference between areas of any two adjacent cross sections of the plurality of cross sections in a third direction is equal to a difference between areas of the two adjacent cross sections in a second direction, the second direction is a preset connecting line direction between the third side surface and the fourth side surface, and the third direction is a preset connecting line direction between the bottom surface and the contact curved surface.

6. The flexible pad according to claim 5, wherein in the first direction, a relationship expression that the difference between the areas of the any two adjacent cross sections of the plurality of cross sections in the second direction is equal to the difference between the areas of the two adjacent cross sections in the third direction is:

$$\Delta S_{hi} = \Delta S_{wli} + \Delta S_{wri};$$

wherein $\Delta S_{hi}$ is the difference between the areas of the two adjacent cross sections in the third direction;

$\Delta S_{wli}$ is a difference between left areas of the two adjacent cross sections in the second direction; and $\Delta S_{wri}$ is a difference between right areas of the two adjacent cross sections in the second direction.

7. The flexible pad according to claim 1, wherein the pressure-relief vent is a blind vent.

8. The flexible pad according to claim 1, wherein a size of the pressure-relief vent corresponds to a size of the opening of the display panel.

9. The flexible pad according to claim 7, wherein a size of the pressure-relief vent corresponds to a size of the opening of the display panel.

10. The flexible pad according to claim 2, wherein in the first direction, a distance between the bottom surface and the contact curved surface gradually decreases from a middle to two sides.

11. The flexible pad according to claim 1, wherein a material of the flexible pad is silica gel.

12. The flexible pad according to claim 1, further comprising:
a first groove between the third side surface and the bottom surface; and
a second groove between the fourth side surface and the bottom surface.

13. The flexible pad according to claim 12, wherein:
the first groove and the second groove are provided with inwardly recessed surfaces, respectively.

14. The flexible pad according to claim 12, wherein:
a shape of the first groove is the same as or different from a shape of the second groove.

15. The flexible pad according to claim 13, wherein:
an orthographic projection of the first groove or the second groove on a cross section perpendicular to the first direction is an arc or an right angle.

16. The flexible pad according to claim 2, further comprising:
a plurality of cross sections uniformly arranged along the first direction;
wherein a difference between areas of any two adjacent cross sections of the plurality of cross sections in a third direction is equal to a difference between areas of the two adjacent cross sections in a second direction, the second direction is a preset connecting line direction between the third side surface and the fourth side surface, and the third direction is a preset connecting line direction between the bottom surface and the contact curved surface.

17. The flexible pad according to claim 3, further comprising:
a plurality of cross sections uniformly arranged along the first direction;
wherein a difference between areas of any two adjacent cross sections of the plurality of cross sections in a third direction is equal to a difference between areas of the two adjacent cross sections in a second direction, the second direction is a preset connecting line direction between the third side surface and the fourth side surface, and the third direction is a preset connecting line direction between the bottom surface and the contact curved surface.

18. A display device, comprising the flexible pad according to claim 1.

* * * * *